(12) United States Patent
Aburada et al.

(10) Patent No.: US 9,268,208 B2
(45) Date of Patent: Feb. 23, 2016

(54) PATTERN GENERATING METHOD, PATTERN FORMING METHOD, AND PATTERN GENERATING PROGRAM

(75) Inventors: Ryota Aburada, Kanagawa (JP); Hiromitsu Mashita, Kanagawa (JP); Taiga Uno, Kanagawa (JP); Masahiro Miyairi, Kanagawa (JP); Toshiya Kotani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 983 days.

(21) Appl. No.: 13/421,688

(22) Filed: Mar. 15, 2012

(65) Prior Publication Data
US 2013/0063707 A1    Mar. 14, 2013

(30) Foreign Application Priority Data
Sep. 14, 2011    (JP) ................. 2011-200891

(51) Int. Cl.
| | |
|---|---|
| G03B 27/42 | (2006.01) |
| G03B 27/54 | (2006.01) |
| G03B 27/68 | (2006.01) |
| G03F 1/36 | (2012.01) |
| G03F 7/20 | (2006.01) |
| G03F 1/70 | (2012.01) |

(52) U.S. Cl.
CPC .. *G03F 1/36* (2013.01); *G03F 1/70* (2013.01); *G03F 7/70441* (2013.01); *G03F 7/70941* (2013.01)

(58) Field of Classification Search
CPC ......... G03F 1/36; G03F 1/70; G03F 7/70441; G03F 7/7055; G03F 7/70908; G03F 7/70941
USPC .......... 355/52, 53, 55, 67–71, 77; 250/492.1, 250/492.2, 492.22, 493.1, 548; 430/5, 8, 430/22, 30, 311, 312
See application file for complete search history.

(56) References Cited

U.S. PATENT DOCUMENTS

| | | | |
|---|---|---|---|
| 5,424,154 A * | 6/1995 | Borodovsky | 430/5 |
| 6,503,667 B1 * | 1/2003 | Kobayashi | 430/5 |
| 6,625,802 B2 | 9/2003 | Singh et al. | |
| 6,815,129 B1 * | 11/2004 | Bjorkholm et al. | 430/30 |
| 7,387,854 B2 * | 6/2008 | Kim | 430/5 |
| 2003/0149956 A1 * | 8/2003 | Singh et al. | 716/21 |
| 2003/0214642 A1 * | 11/2003 | Yang | 355/51 |
| 2005/0216878 A1 * | 9/2005 | Word et al. | 716/21 |
| 2005/0233226 A1 * | 10/2005 | Osawa et al. | 430/5 |
| 2005/0250021 A1 * | 11/2005 | Chen et al. | 430/5 |
| 2006/0210885 A1 * | 9/2006 | Ziger et al. | 430/5 |
| 2010/0227261 A1 * | 9/2010 | Shiraishi | 430/5 |

FOREIGN PATENT DOCUMENTS

| | | |
|---|---|---|
| JP | 01035916 A * | 2/1989 |
| JP | 2003-338454 | 11/2003 |
| JP | 2007-524255 | 8/2007 |

(Continued)

*Primary Examiner* — Christina Riddle
(74) *Attorney, Agent, or Firm* — Finnegan, Henderson, Farabow, Garrett & Dunner, L.L.P.

(57) ABSTRACT

One embodiment includes: a step of evaluating an amount of flare occurring through a mask at EUV exposure; a step of providing a dummy mask pattern on the mask based on the evaluated result of the amount of flare; and a step of executing a flare correction and an optical proximity correction on a layout pattern. The layout pattern is provided by the EUV exposure through the mask with the dummy mask pattern.

6 Claims, 8 Drawing Sheets

(56) References Cited　　　　　　　　　　　　　　　* cited by examiner

FOREIGN PATENT DOCUMENTS

| | | |
|---|---|---|
| JP | 2011-023549 | 2/2011 |
| WO | WO 2005/082063 A2 | 9/2005 |
| WO | WO 2005/082063 A3 | 9/2005 |

PATTERN GENERATING METHOD, PATTERN FORMING METHOD, AND PATTERN GENERATING PROGRAM

CROSS-REFERENCE TO RELATED APPLICATIONS

This application is based upon and claims the benefit of priority from Japanese Patent Application No. 2011-200891, filed on Sep. 14, 2011; the entire contents of which are incorporated herein by reference.

FIELD

Embodiments described herein relate generally to a pattern generating method, a pattern forming method, and a pattern generating program.

BACKGROUND

To achieve scaling down and high integration of pattern generating apparatuses, a lithography technology using Extreme Ultra Violet (EUV) light source has been developed. In the lithography using the EUV light source, a wavelength of the light source is shorter than that of an argon fluoride (ArF) light source. Thus this exposure apparatus generates large scattering in a reduction optical system. The scattered light (flare) may cause light leakage from an opening portion of a mask pattern, thus varying a size of a resist pattern formed on a substrate. In order to reduce an influence of the flare and evaluate an optical proximity effect precisely, a dummy pattern may be disposed around a pattern to be evaluated so as to ensure uniform flare intensity.

DETAILED DESCRIPTION

Pattern generating methods according to embodiments evaluate an amount of flare, which occurs through a mask at EUV exposure, add a dummy mask pattern to the mask based on the evaluation result of the amount of flare, and perform flare correction and optical proximity correction on a layout pattern exposed to the EUV radiation through the mask including the dummy mask pattern.

The pattern generating methods and pattern forming methods according to embodiments will be described below with reference to the accompanying drawings. The present invention should not be construed in a limiting sense according to these embodiments.

First Embodiment

Figure 1:
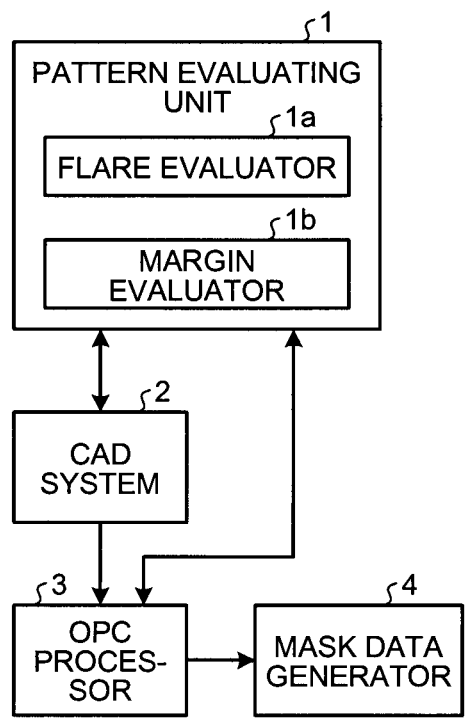
FIG. 1 is a block diagram illustrating a schematic configuration of a pattern generating apparatus according to a first embodiment.

FIG. 1 is a block diagram illustrating a schematic configuration of a pattern generating apparatus according to a first embodiment.

In FIG. 1, the pattern generating apparatus includes a pattern evaluating unit 1, a CAD system 2, an Optical Proximity Correction (OPC) processor 3, and a mask data generator 4. The pattern evaluating unit 1 includes a flare evaluator 1a and a margin evaluator 1b.

Here, the CAD system 2 can generate design layout data corresponding to layout patterns of respective layers in a semiconductor integrated circuit. The design layout data includes, for example, sizes and locations of layout patterns for the respective layers. The design layout data may employ a data format of, for example, text coordinate data, GDS data, OASIS data, HSS data, or image data (in Tiff, Bit Map, or Jpeg format).

The OPC processor 3 can perform an optical proximity correction process on the layout pattern specified by the design layout data, which is generated by the CAD system 2. The mask data generator 4 can generate mask data corresponding to the design layout data on which the optical proximity correction process is performed.

The pattern evaluating unit 1 evaluates the amount of flare and a lithography margin of each of the layout pattern generated by the CAD system 2 and the layout pattern on which the optical proximity correction process is performed by the OPC processor 3. Here, the pattern evaluating unit 1 includes the flare evaluator 1a and the margin evaluator 1b. The flare evaluator 1a can evaluate the amount of the flare which occurs through the mask at EUV exposure. At this time, a dummy mask pattern can be added to the mask to ensure a uniform amount of the flare that occurs through the mask. The flare evaluator 1a can evaluate the amount of flare of the layout pattern on which the flare correction and the optical proximity correction process are performed. This flare correction can compensate for a variation of a size of a resist pattern caused by the flare that occurs through the mask at the EUV exposure. The margin evaluator 1b can evaluate a lithography margin of the layout pattern on which the flare correction and the optical proximity correction process are performed.

The CAD system 2 generates the design layout data corresponding to the layout patterns of respective layers in the semiconductor integrated circuit, and sends the design layout data to the OPC processor 3. The CAD system 2 can add a dummy mask pattern to the mask pattern corresponding to the layout pattern in the semiconductor integrated circuit so as to ensure a uniform amount of flare that occurs through the mask at the EUV exposure. The OPC processor 3 performs the optical proximity correction on the layout pattern that is obtained from the design layout data, which is generated by the CAD system 2, and sends the corrected layout pattern to the mask data generator 4. In the case where the OPC processor 3 performs the optical proximity correction, it is possible to correct the design layout data so as to provide the minimum difference in size from the layout pattern obtained from the design layout data when a photolithography is performed while keeping exposure conditions such as an amount of exposure and a focus position in the best condition.

Then the design layout data is generated by the CAD system 2, and the flare evaluator 1a subsequently evaluates an amount of flare irradiated to a substrate through the mask with the dummy mask pattern. A shot region where an amount of flare exceeds a predetermined range is extracted, and addition, modification, or removal of the dummy mask pattern to be added to the mask is then performed in order for the amount of flare to fall into the predetermined range.

In the case where the amounts of flare, which is irradiated to the substrate through the mask with the dummy mask pattern, falls into the predetermined range, the OPC processor 3 performs the optical proximity correction on the layout pattern while the CAD system 2 performs the flare correction. The margin evaluator 1b evaluates the lithography margin of the layout pattern on which the optical proximity correction and the flare correction are performed. In the case where the layout pattern does not satisfy a predetermined lithography margin, the optical proximity correction and the flare correction are repeated until the layout pattern satisfies the lithography margin.

Figure 2:
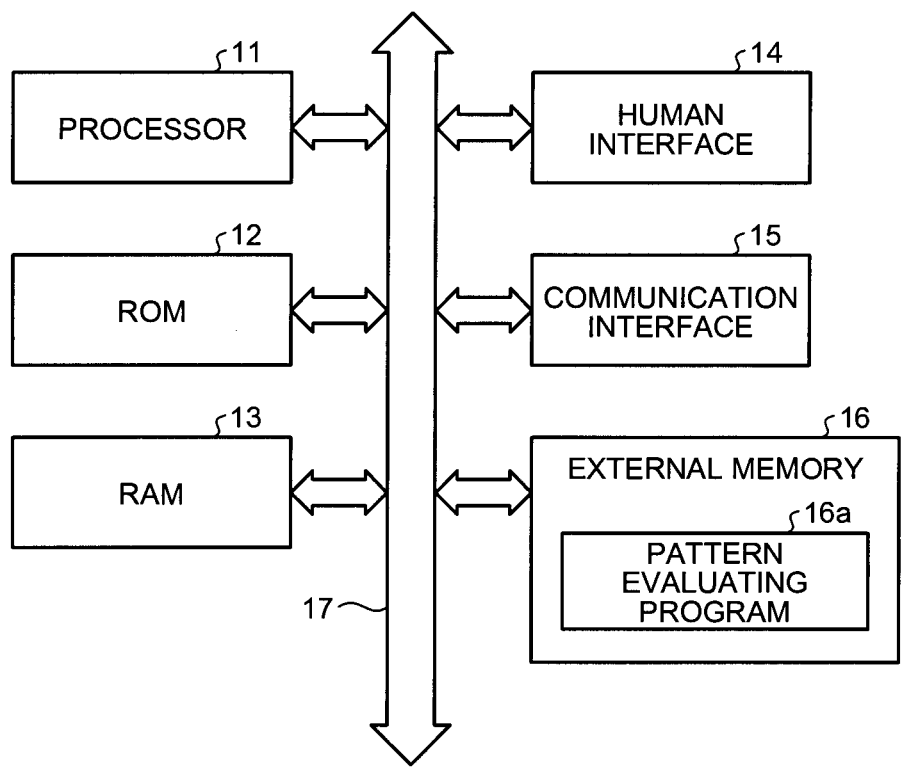
FIG. 2 is a block diagram illustrating an exemplary hardware configuration of the pattern evaluating unit shown in FIG. 1.

FIG. 2 is a block diagram illustrating an exemplary hardware configuration of the pattern evaluating unit in FIG. 1.

In FIG. 2, the pattern evaluating unit 1 includes: a processor 11, which includes a CPU and other parts; a ROM 12, which stores fixed data; a RAM 13, which provides, for example, a work area to the processor 11; a human interface 14, which interfaces between a human user and a computer; a communication interface 15, which provides communicating means for communicating with the outside; and an external memory 16, which stores programs for executing the processor 11 and various kinds of data. The processor 11, the ROM 12, the RAM 13, the human interface 14, the communication interface 15, and the external memory 16 are coupled together via a bus 17.

The external memory 16 may employ a magnetic disk such as a hard disk, an optical disk such as a DVD, and a portable semiconductor memory unit such as a USB flash drive and a memory card. The human interface 14 may employ: an input interface such as a keyboard, a computer mouse, and a touchscreen; and an output interface such as a display and a printer. The communication interface 15 may employ, for example, a LAN card, a modem, or a router, for connecting to Internet, a LAN, and the like.

Here, the external memory 16 includes an installed pattern evaluating program 16a for evaluating the amount of flare and the lithography margin of the layout pattern, which is generated by the CAD system 2, and the layout pattern on which the OPC processor 3 performed the optical proximity correction process.

When the pattern evaluating program 16a is executed by the processor 11, the amount of flare and the lithography margin of each of the layout pattern generated by the CAD system 2 and the layout pattern on which the OPC processor 3 performed the optical proximity correction process are evaluated. Then the amounts of flare and the lithography margins are sent to the CAD system 2 and the OPC processor 3.

The pattern evaluating program 16a for execution by the processor 11 may be stored in the external memory 16 and read into the RAM 13 at running the program. Alternatively, the pattern evaluating program 16a may be preliminary stored in the ROM 12 or may be obtained through the communication interface 15. The pattern evaluating program 16a may be executed by a stand-alone computer or a cloud computer.

Second Embodiment

Figure 3:
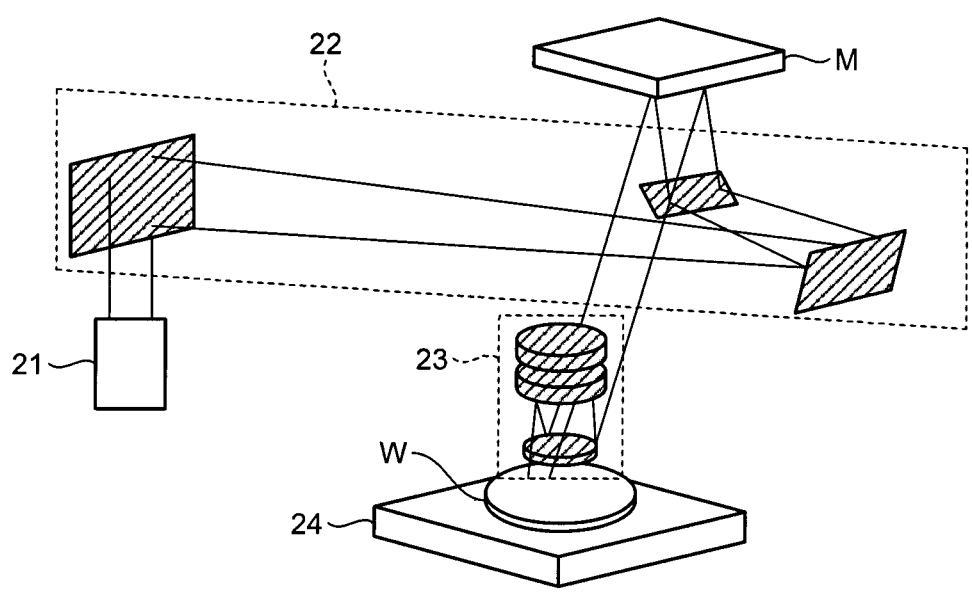
FIG. 3 is a perspective view of a schematic configuration of an EUV exposure equipment with an exposure mask according to a second embodiment.

FIG. 3 is a perspective view illustrating a schematic configuration of an EUV exposure equipment with an exposure mask according to a second embodiment.

In FIG. 3, the EUV exposure equipment includes: a EUV light source 21, which generates an EUV light; a lighting optical system 22, which leads the EUV light emitted from the EUV light source 21 to an exposure mask M; a projection optical system 23, which projects the EUV light reflected by the exposure mask M on a wafer W; a wafer stage 24, on which the wafer W is placed; and the exposure mask M, which includes a mask pattern corresponding to a layout pattern projected on the wafer W. Here, the exposure mask M may include the dummy mask pattern so as to ensure a uniform amount of flare irradiated on the wafer W through the exposure mask M.

The EUV light may be set to have, for example, a wavelength of approximately 13 to 14 nm. The exposure mask M may employ a mirror board that reflects the EUV light. The mirror board may include a light absorbing pattern to form a mask pattern. The mirror board may employ, for example, a multilayer reflecting film made of a Mo/Si multilayer film. The light absorbing pattern may employ a tantalum material.

Here, in the case where the dummy mask pattern is added to the exposure mask M, a dummy layout pattern corresponding to this dummy mask pattern is formed on the wafer W. In this case, removing the dummy layout pattern from the wafer W provides freedom in the layout of the dummy mask pattern. This reduces a variation in the amount of flare irradiated on the wafer W, thus reducing a variation in size of the layout pattern formed on the wafer W.

Third Embodiment

Figure 4:
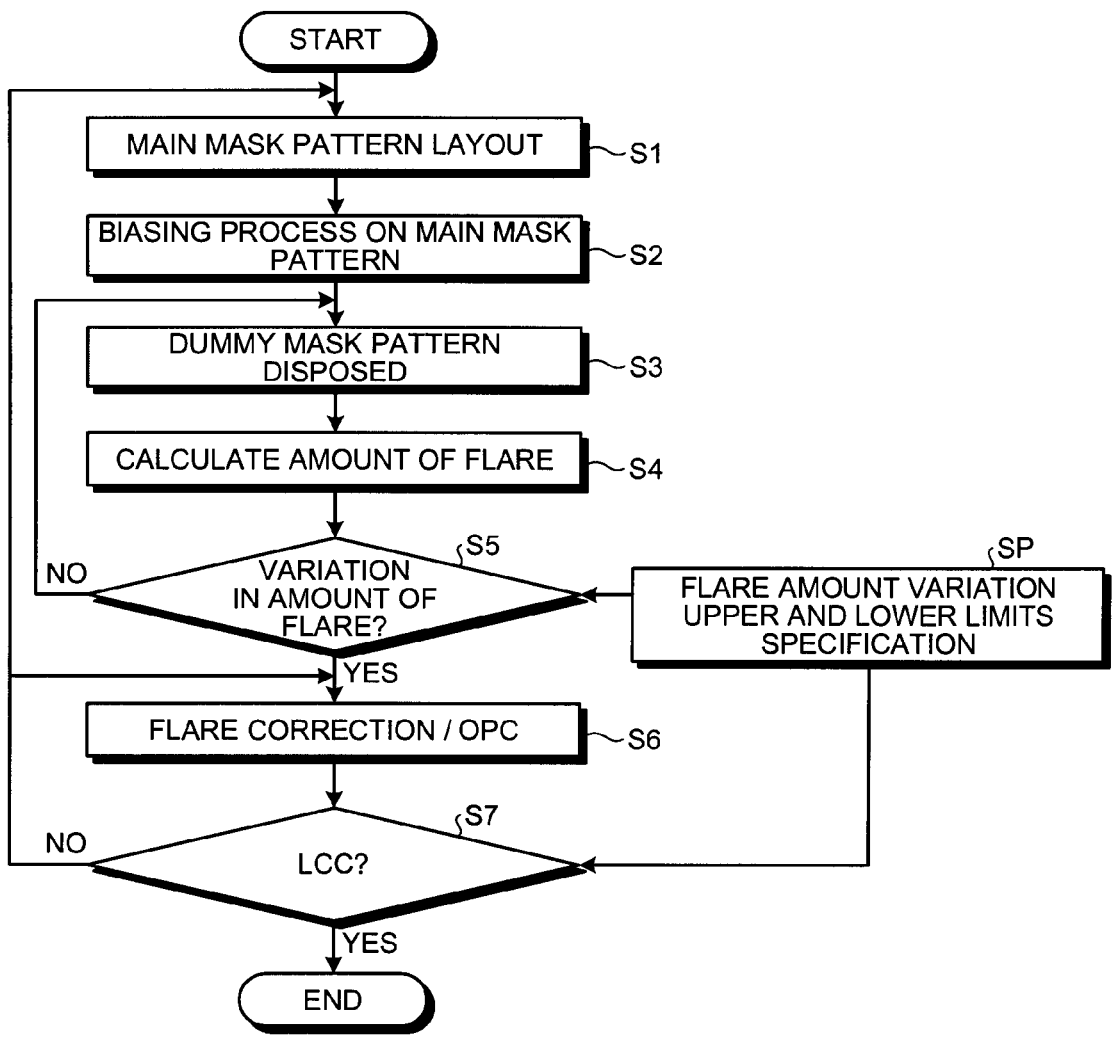
FIG. 4 is a flowchart of a pattern generating method according to a third embodiment.

FIG. 4 is a flowchart of a pattern generating method according to a third embodiment. In the third embodiment, it is assumed that a dummy layout pattern is removed from a wafer W by slimming process in the case where the dummy layout pattern corresponding to a dummy mask pattern is formed on the wafer W. In FIG. 4, a layout of a main mask pattern is executed on an exposure mask (S1), and a biasing process is then performed on the main mask pattern (S2). The main mask pattern corresponds to a layout pattern of a semiconductor integrated circuit to be formed on the wafer W. The biasing process thickens a line width of the main mask pattern by the amount of line width that is to be removed by the slimming for removing the dummy layout pattern, which is formed corresponding to the dummy mask pattern.

Next, the dummy mask pattern is added to the exposure mask (S3), and the amount of flare irradiated on a substrate through the exposure mask is then calculated (S4). It is determined whether the amount of flare satisfies an upper and lower limits specification SP of a flare amount variation (S5).

When the amount of flare does not satisfy the upper and lower limits specification SP of the flare amount variation, addition, modification, or removal of the dummy mask pattern is repeated until the amount of flare satisfies the upper and lower limits specification SP of the flare amount variation.

Next, when the amount of flare satisfies the upper and lower limits specification SP of the flare amount variation, the optical proximity correction and the flare correction are performed on the main mask pattern (S6). Then a lithography compliance check (LCC) is performed using a lithography simulation on the main mask pattern on which the optical proximity correction and the flare correction are performed, thus evaluating a lithography margin (S7). When the main mask pattern does not satisfy the lithography margin, the process returns to the step S1, and the above process is repeated until the main mask pattern satisfies the lithography margin.

Fourth Embodiment

Figure 5A:
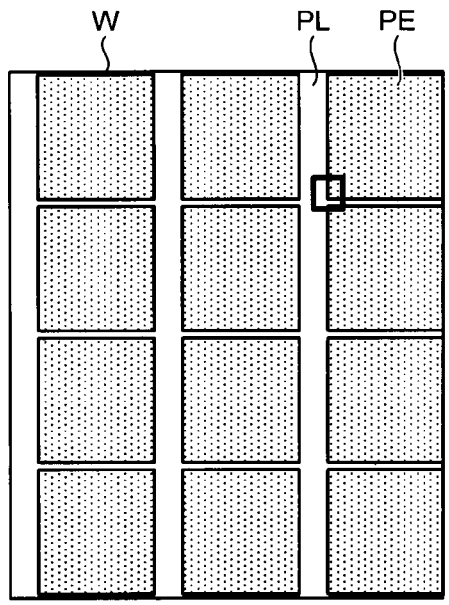
FIG. 5A is a plan view illustrating an exemplary layout of an EUV-exposure-formed layout pattern PE and a light-exposure-formed layout pattern PL according to a fourth embodiment.
Figure 5B:
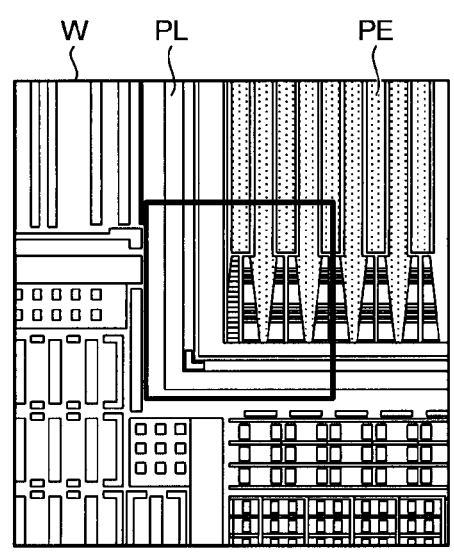
FIG. 5B is an enlarged partial plan view illustrating the EUV-exposure-formed layout pattern PE and the light-exposure-formed layout pattern PL shown in FIG. 5A.
Figure 5C:
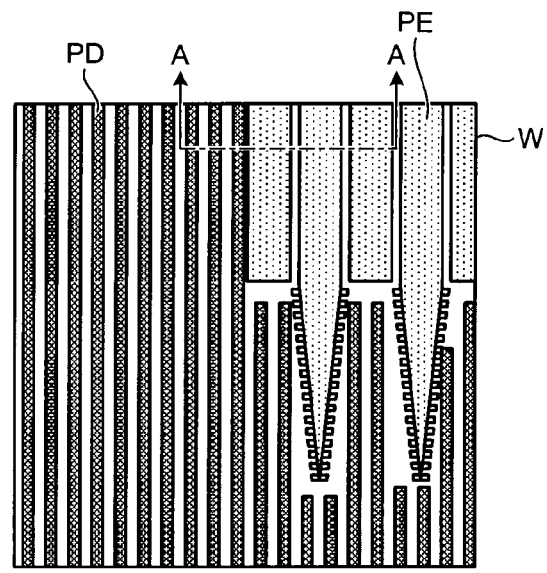
FIG. 5C is an enlarged plan view of an exemplary layout including a dummy layout pattern PD instead of the light-exposure-formed layout pattern PL shown in FIG. 5B.

FIG. 5A is a plan view illustrating an exemplary layout of an EUV-exposure-formed layout pattern PE and a light-exposure-formed layout pattern PL according to a fourth embodiment. FIG. 5B is an enlarged partial plan view illustrating the EUV-exposure-formed layout pattern PE and the light-exposure-formed layout pattern PL shown in FIG. 5A. FIG. 5C is an enlarged plan view of an exemplary layout including a dummy layout pattern PD instead of the light-exposure-formed layout pattern PL shown in FIG. 5B.

In FIG. 5A and FIG. 5B, the EUV-exposure-formed layout pattern PE is formed on a wafer W after the EUV exposure, and the light-exposure-formed layout pattern PL is formed after the light exposure. The EUV-exposure-formed layout pattern PE may be constituted by, for example, a line and space pattern. The light exposure may employ a light with a longer wavelength than that of a light in the EUV exposure such as an excimer laser beam and a visible light.

In FIG. 5C, before the light-exposure-formed layout pattern PL is formed on the wafer W, the dummy layout pattern PD may be formed on that region. At the EUV exposure, the dummy layout pattern PD may be formed on the wafer W together with the EUV-exposure-formed layout pattern PE. This reduces variation in the amount of flare irradiated on the wafer W.

After the EUV exposure, the dummy layout pattern PD is removed from the wafer W. This allows to form the light-exposure-formed layout pattern PL on that region. This eliminates the need for the dummy layout pattern PD to avoid the light-exposure-formed layout pattern PL, thus increasing freedom in the location of the dummy layout pattern PD. This ensures a uniform amount of flare irradiated on the wafer W.

Fifth Embodiment

FIG. 6A to FIG. 6G are cross-sectional views illustrating an exemplary pattern forming method according to a fifth embodiment. The cross-sectional views are taken along the line A-A shown in FIG. 5C.

Figure 6A:
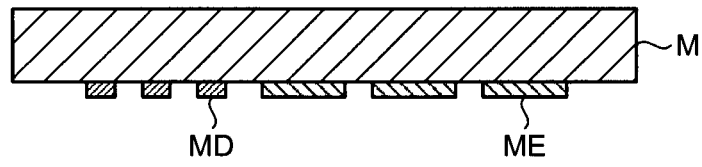
FIG. 6A to FIG. 6G are cross-sectional views illustrating an exemplary pattern forming method according to a fifth embodiment.

In FIG. 6A, an exposure mask M includes a mask pattern ME and a dummy mask pattern MD. The exposure mask M may employ a base material such as a mirror board. The mask pattern ME and the dummy mask pattern MD may be made of a light absorbing material.

Figure 6B:
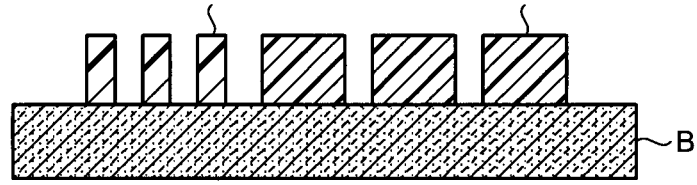

As shown in FIG. 6B, the EUV lithography is performed through the exposure mask M to form the EUV-exposure-formed layout pattern PE and the dummy layout pattern PD respectively corresponding to the mask pattern ME and the dummy mask pattern MD on a base layer B. The base layer B may be a semiconductor substrate, an insulating layer formed on a semiconductor substrate, or a conducting layer formed on an insulating layer. For example, the base layer B may be a polysilicon film used for a word line of a NAND flash memory or a semiconductor substrate with trenches to be formed. The EUV-exposure-formed layout pattern PE and the dummy layout pattern PD may be made of a resist material or a hard mask material such as a BSG film and a silicon nitride film.

Line width of the dummy layout pattern PD may be set to be removed by slimming process. The EUV-exposure-formed layout pattern PE may be thickened by the amount of line width that is to be removed in the slimming process for removing the dummy layout pattern PD.

Figure 6C:
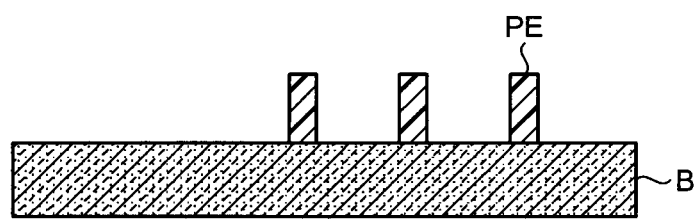

Next, as shown in FIG. 6C, the slimming process removes the dummy layout pattern PD from the base layer B while thinning the EUV-exposure-formed layout pattern PE. The slimming process may employ an isotropic etching such as a plasma etching.

Figure 6D:
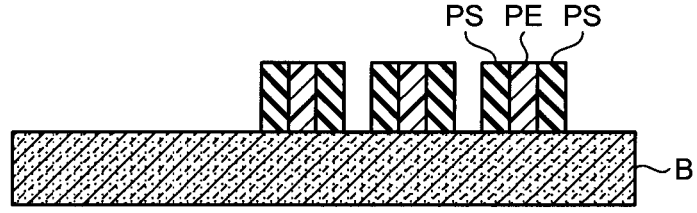

Next, as shown in FIG. 6D, a method such as a CVD method is employed to deposit a sidewall material on the base layer B so as to cover the whole EUV-exposure-formed layout pattern PE. Performing the anisotropic etching of the sidewall material forms a sidewall pattern PS on a side face of the EUV-exposure-formed layout pattern PE.

Figure 6E:
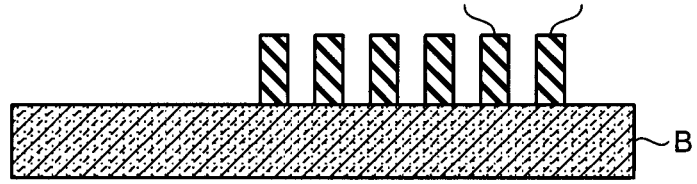

Next, as shown in FIG. 6E, a method such as a wet etching is employed to remove the EUV-exposure-formed layout pattern PE from the base layer B while leaving the sidewall pattern PS on the base layer B.

Figure 6F:
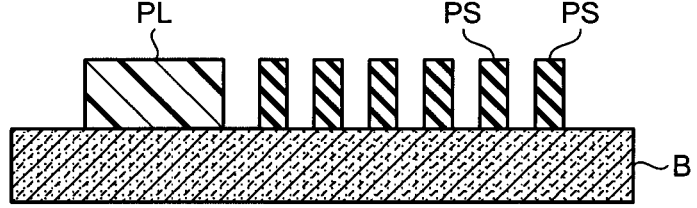

Next, as shown in FIG. 6F, a light lithography is performed to form the light-exposure-formed layout pattern PL on the region where the dummy layout pattern PD has been removed.

Figure 6G:
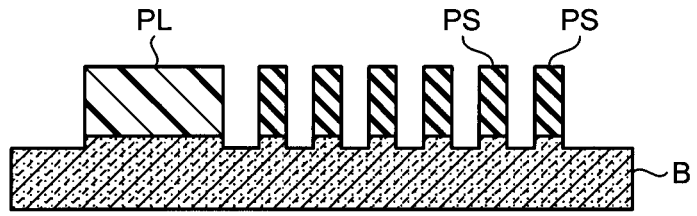

Next, as shown in FIG. 6G, the base layer B is etched through the sidewall pattern PS and the light-exposure-formed layout pattern PL to transfer the sidewall pattern PS and the light-exposure-formed layout pattern PL to the base layer B. For example, in a NAND flash memory, the sidewall pattern PS may be used to form a word line, while the light-exposure-formed layout pattern PL may be used to form a lead line from the word line.

Here, after the EUV exposure, the dummy layout pattern PD is removed from the base layer B. This eliminates the need for the dummy layout pattern PD to avoid the light-exposure-formed layout pattern PL, thus increasing freedom in the location of the dummy layout pattern PD. This ensures a uniform amount of flare irradiated on the base layer B through the exposure mask M at the EUV exposure.

Sixth Embodiment

Figure 7:
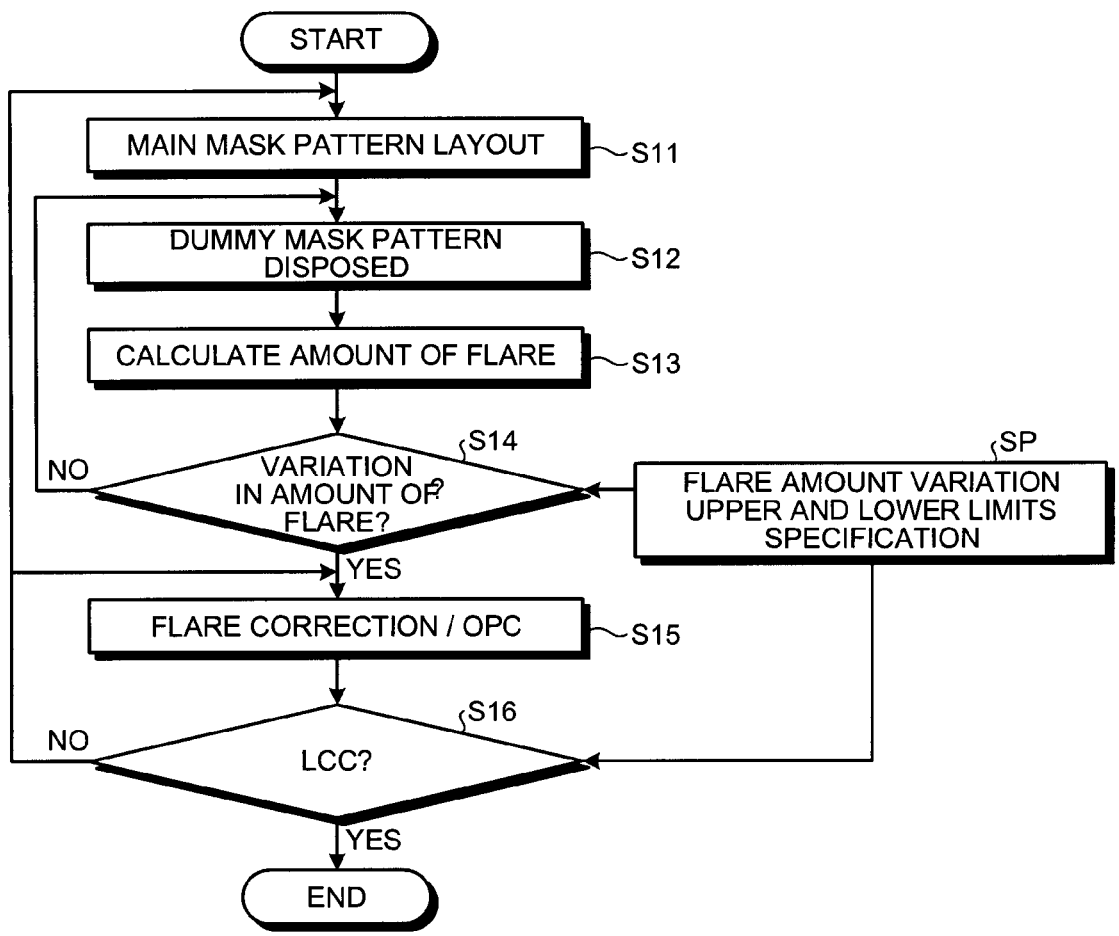
FIG. 7 is a flowchart of a pattern generating method according to a sixth embodiment.

FIG. 7 is a flowchart of a pattern generating method according to a sixth embodiment. In the third embodiment, it is assumed that a dummy layout pattern is removed from a wafer W by etching process in the case where the dummy layout pattern corresponding to a dummy mask pattern is formed on the wafer W.

In FIG. 7, a layout of a main mask pattern is executed on an exposure mask (S11). Next, the dummy mask pattern is added to the exposure mask (S12), and the amount of flare irradiated on a substrate through the exposure mask is then calculated (S13). It is determined whether the amount of flare satisfies an upper and lower limits specification SP of a flare amount variation (S14). When the amount of flare does not satisfy the upper and lower limits specification SP of the flare amount variation, addition, modification, or removal of the dummy mask pattern is repeated until the amount of flare satisfies the upper and lower limits specification SP of the flare amount variation.

Next, when the amount of flare satisfies the upper and lower limits specification SP of the flare amount variation, the optical proximity correction and the flare correction are performed on the main mask pattern (S15). Then a lithography compliance check (LCC) is performed using a lithography simulation on the main mask pattern on which the optical proximity correction and the flare correction are performed, thus evaluating a lithography margin (S16). When the main mask pattern does not satisfy the lithography margin, the process returns to the step S11, and the above process is repeated until the main mask pattern satisfies the lithography margin.

Seventh Embodiment

Figure 8A:
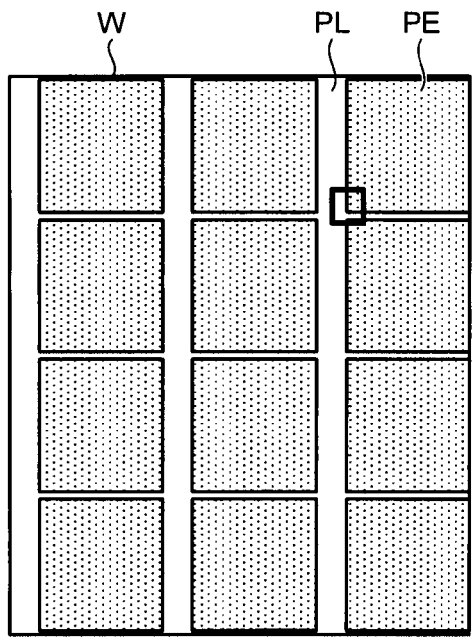
FIG. 8A is a plan view illustrating an exemplary layout of an EUV-exposure-formed layout pattern PE and a light-exposure-formed layout pattern PL according to a seventh embodiment.
Figure 8B:
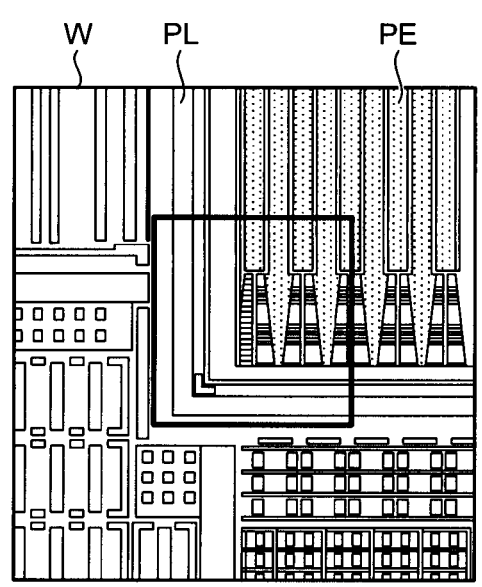
FIG. 8B is an enlarged partial plan view illustrating the EUV-exposure-formed layout pattern PE and the light-exposure-formed layout pattern PL shown in FIG. 8A.
Figure 8C:
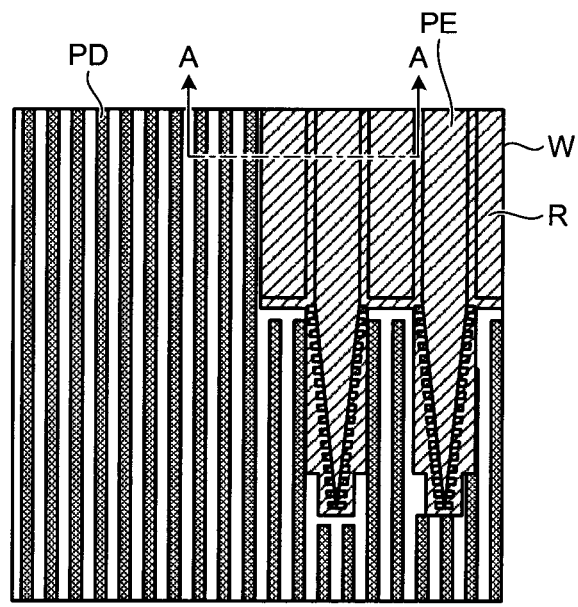
FIG. 8C is an enlarged plan view of an exemplary layout including a dummy layout pattern PD instead of the light-exposure-formed layout pattern PL shown in FIG. 8B.

FIG. 8A is a plan view illustrating an exemplary layout of an EUV-exposure-formed layout pattern PE and a light-exposure-formed layout pattern PL according to a seventh embodiment. FIG. 8B is an enlarged partial plan view illustrating the EUV-exposure-formed layout pattern PE and the light-exposure-formed layout pattern PL shown in FIG. 8A. FIG. 8C is an enlarged plan view of an exemplary layout including a dummy layout pattern PD instead of the light-exposure-formed layout pattern PL shown in FIG. 8B.

In FIG. 8A and FIG. 8B, the EUV-exposure-formed layout pattern PE is formed on a wafer W after the EUV exposure, and the light-exposure-formed layout pattern PL is formed after the light exposure.

In FIG. 8C, before the light-exposure-formed layout pattern PL is formed on the wafer W, the dummy layout pattern PD may be formed on that region. After the EUV exposure, a resist pattern R is formed on the wafer W in order to remove the dummy layout pattern PD from the wafer W. The resist pattern R covers the EUV-exposure-formed layout pattern PE and exposes the dummy layout pattern PD. Etching the dummy layout pattern PD through the resist pattern R removes the dummy layout pattern PD from the wafer W.

Eighth Embodiment

FIG. 9A to FIG. 9H are cross-sectional views illustrating an exemplary pattern forming method according to an eighth embodiment. The cross-sectional views are taken along the line A-A shown in FIG. 8C.

Figure 9A:
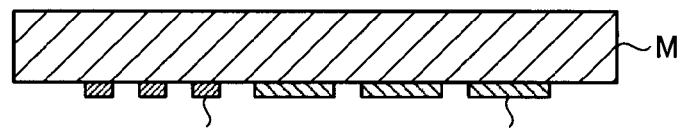
FIG. 9A to FIG. 9H are cross-sectional views illustrating an exemplary pattern forming method according to an eighth embodiment.
Figure 9B:

In FIG. 9A, an exposure mask M includes a mask pattern ME and a dummy mask pattern MD. As shown in FIG. 9B, the EUV lithography is performed through the exposure mask M to form the EUV-exposure-formed layout pattern PE and the dummy layout pattern PD respectively corresponding to the mask pattern ME and the dummy mask pattern MD on a base layer B.

Figure 9C:
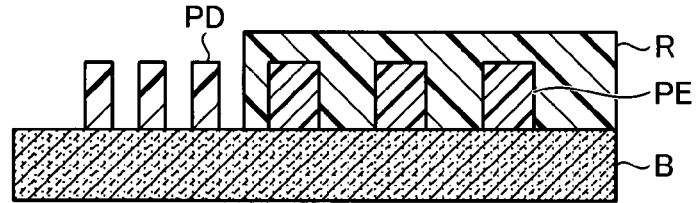

Next, as shown in FIG. 9C, use of a photolithography technology forms a resist pattern R that covers the EUV-exposure-formed layout pattern PE and exposes the dummy layout pattern PD on the base layer B.

Figure 9D:
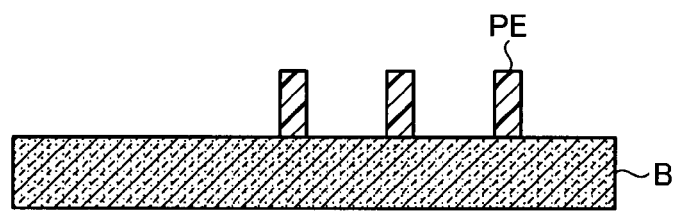

Next, as shown in FIG. 9D, etching the dummy layout pattern PD through the resist pattern R removes the dummy layout pattern PD from the base layer B.

Figure 9E:
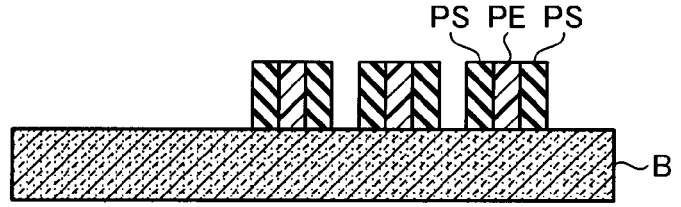

Next, as shown in FIG. 9E, a method such as a CVD method is employed to deposit a sidewall material on the base layer B so as to cover the whole EUV-exposure-formed layout pattern PE. Performing the anisotropic etching of the sidewall material forms a sidewall pattern PS on a side face of the EUV-exposure-formed layout pattern PE.

Figure 9F:
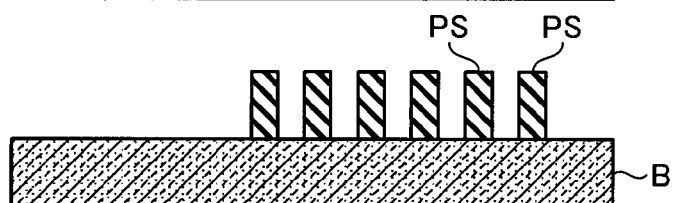

Next, as shown in FIG. 9F, a method such as a wet etching is employed to remove the EUV-exposure-formed layout pattern PE from the base layer B while leaving the sidewall pattern PS on the base layer B.

Figure 9G:
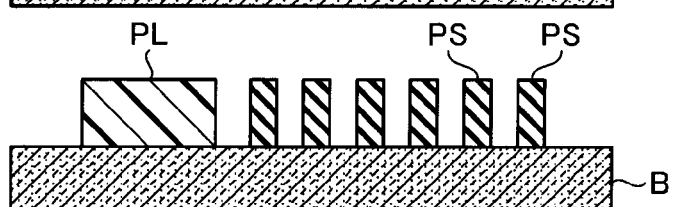

Next, as shown in FIG. 9G, a light lithography is performed to form the light-exposure-formed layout pattern PL on the region where the dummy layout pattern PD has been removed.

Figure 9H:
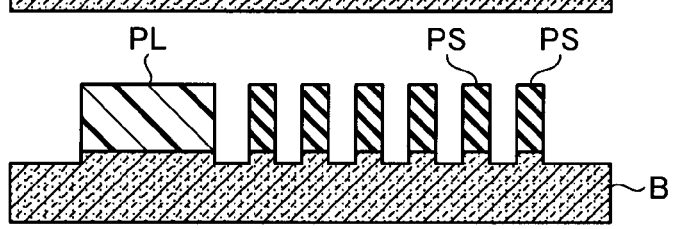

Next, as shown in FIG. 9H, the base layer B is etched through the sidewall pattern PS and the light-exposure-formed layout pattern PL to transfer the sidewall pattern PS and the light-exposure-formed layout pattern PL to the base layer B. For example, in a NAND flash memory, the sidewall pattern PS may be used to form a word line, while the light-exposure-formed layout pattern PL may be used to form a lead line from the word line.

Here, after the EUV exposure, the dummy layout pattern PD is removed from the base layer B. This eliminates the need for the dummy layout pattern PD to avoid the light-exposure-formed layout pattern PL, thus increasing freedom in the location of the dummy layout pattern PD. This ensures a uniform amount of flare irradiated on the base layer B through the exposure mask M at the EUV exposure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern generating method comprising:
    evaluating an amount of flare occurring through a mask at EUV exposure, the mask having a main mask pattern;
    providing a dummy mask pattern on the mask based on the evaluated result of the amount of flare;
    executing a flare correction and an optical proximity correction on a layout pattern formed by the EUV exposure through the mask with the dummy mask pattern; and
    executing a bias process on the main mask pattern of the mask to thicken a line width of the main mask pattern by an amount of line width that is to be removed by a slimming process that removes a dummy layout pattern on a wafer formed corresponding to the dummy mask pattern.

2. The pattern generating method according to claim 1, wherein
    one of addition, modification, and removal of the dummy mask pattern is repeated until the amount of flare satisfies an upper and lower limits specification of a flare amount variation.

3. The pattern generating method according to claim 2, wherein
    a lithography margin is evaluated by lithography simulation of the layout pattern provided with the EUV exposure through the mask when the amount of flare satisfies the upper and lower limits specification of the flare amount variation, and
    one of addition, modification, and removal of a mask pattern of the mask and the dummy mask pattern is repeated until the lithography margin is satisfied.

4. The pattern generating method according to claim 1, wherein the dummy layout pattern on the wafer corresponding to the dummy mask pattern on the mask is formed on a region where a light-exposure-formed layout pattern is disposed on the wafer.

5. A non-transitory computer-readable storage medium storing a pattern generating program to cause a computer to execute a method comprising:
   evaluating an amount of flare occurring through a mask at EUV exposure;
   executing a flare correction and an optical proximity correction on a layout pattern formed by the EUV exposure through the mask with a main mask pattern and a dummy mask pattern, the dummy mask pattern being provided on the mask based on the evaluated result of the amount of flare; and
   executing a bias process on the main mask pattern of the mask to thicken a line width of the main mask pattern by an amount of line width that is to be removed by a slimming process that removes a dummy layout pattern on a wafer formed corresponding to the dummy mask pattern.

6. The non-transitory computer-readable storage medium according to claim 5, wherein the method further comprises:
   repeating one of addition, modification, and removal of the dummy mask pattern until the amount of flare satisfies an upper and lower limits specification of a flare amount variation; and
   evaluating a lithography margin by lithography simulation of the layout pattern provided with the EUV exposure through the mask when the amount of flare satisfies the flare amount variation upper and lower limits specification, wherein
   one of addition, modification, and removal of a mask pattern of the mask and the dummy mask pattern is repeated until the lithography margin is satisfied.

* * * * *